(12) United States Patent
Willson et al.

(10) Patent No.: US 7,906,060 B2
(45) Date of Patent: Mar. 15, 2011

(54) COMPOSITIONS FOR DARK-FIELD POLYMERIZATION AND METHOD OF USING THE SAME FOR IMPRINT LITHOGRAPHY PROCESSES

(75) Inventors: Carlton Grant Willson, Austin, TX (US); Nicholas A. Stacey, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 12/105,704

(22) Filed: Apr. 18, 2008

(65) Prior Publication Data

US 2008/0230959 A1    Sep. 25, 2008

Related U.S. Application Data

(63) Continuation of application No. 10/318,273, filed on Dec. 12, 2002, now Pat. No. 7,365,103.

(51) Int. Cl.
 *B29C 35/08* (2006.01)

(52) U.S. Cl. ......... 264/336; 264/494; 264/496; 264/293; 264/284; 264/319; 522/31; 430/270.1

(58) Field of Classification Search ............ 264/1.38, 264/336, 494, 496, 293, 284; 522/31; 430/270.1
See application file for complete search history.

(56) References Cited

U.S. PATENT DOCUMENTS

| | | | |
|---|---|---|---|
| 4,180,642 A | 12/1979 | Takago | |
| 4,617,238 A | 10/1986 | Crivella et al. | |
| 5,039,716 A * | 8/1991 | Vara et al. | 522/96 |
| 5,077,174 A * | 12/1991 | Bauer et al. | 430/270.1 |
| 5,331,020 A | 7/1994 | Brown et al. | |
| 5,409,963 A | 4/1995 | Takfoka | |
| 5,437,896 A | 8/1995 | Kloosterboer et al. | |
| 5,594,042 A | 1/1997 | Glover et al. | |
| 5,629,095 A | 5/1997 | Bujanowski et al. | |
| 5,650,261 A | 7/1997 | Winkle | |
| 5,667,918 A * | 9/1997 | Brainerd et al. | 430/5 |
| 5,696,179 A | 12/1997 | Chawla | |
| 5,861,467 A | 1/1999 | Bujanowski et al. | |
| 6,334,960 B1 | 1/2002 | Willson et al. | |
| 6,517,995 B1 * | 2/2003 | Jacobson et al. | 430/320 |
| 6,719,915 B2 | 4/2004 | Willson et al. | |
| 6,957,608 B1 | 10/2005 | Hubert | |
| 7,307,118 B2 | 12/2007 | Xu et al. | |
| 7,309,225 B2 | 12/2007 | McMackin et al. | |
| 7,365,103 B2 | 4/2008 | Willson et al. | |
| 2001/0040145 A1 * | 11/2001 | Willson et al. | 216/52 |
| 2001/0056197 A1 | 12/2001 | Albert et al. | |
| 2003/0235787 A1 * | 12/2003 | Watts et al. | 430/280.1 |
| 2004/0168613 A1 | 9/2004 | Truskett et al. | |
| 2005/0098534 A1 | 5/2005 | Sreenivasan et al. | |
| 2005/0160934 A1 | 7/2005 | Xu et al. | |
| 2005/0187339 A1 | 8/2005 | Xu et al. | |
| 2005/0218481 A1 | 10/2005 | Lee et al. | |
| 2006/0062922 A1 | 3/2006 | Xu et al. | |

(Continued)

*Primary Examiner* — Khanh Nguyen
*Assistant Examiner* — Margaret Squalls
(74) *Attorney, Agent, or Firm* — Heather L. Flanagan; Fish & Richardson P.C.

(57) ABSTRACT

The present invention provides a composition and a method of using the same to form a pattern on a substrate using imprint lithography employing dark-field polymerization. To that end, the composition includes a bis vinyl ether component, and an initiator component that produces an acid in response to radiation. The bis vinyl ether component is reactive to the acid and polymerizes in response thereto.

22 Claims, 4 Drawing Sheets

U.S. PATENT DOCUMENTS

| | | |
|---|---|---|
| 2006/0108710 A1 | 5/2006 | Xu et al. |
| 2006/0145398 A1 | 7/2006 | Bailey et al. |
| 2006/0175736 A1 | 8/2006 | Xu et al. |
| 2006/0279024 A1 | 12/2006 | Choi et al. |
| 2007/0272825 A1 | 11/2007 | Xu et al. |
| 2008/0110557 A1 | 5/2008 | Xu |

* cited by examiner

COMPOSITIONS FOR DARK-FIELD POLYMERIZATION AND METHOD OF USING THE SAME FOR IMPRINT LITHOGRAPHY PROCESSES

CROSS-REFERENCE TO RELATED APPLICATIONS

This Application for Patent is a Continuation of U.S. patent application Ser. No. 10/318,273 filed Dec. 12, 2002, now U.S. Pat. No. 7,365,103, which is incorporated herein by reference.

BACKGROUND OF THE INVENTION

The field of invention relates generally to micro-fabrication of structures. More particularly, the present invention is directed to patterning substrates in furtherance of the formation of structures.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the transfer layer that contains a relief structure complimentary to that of the mold. The mold is then separated from the solidified polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer. The time required and the minimum feature dimension provided by this technique is dependent upon, inter alia, the composition of the polymerizable material.

It is desired, therefore, to provide improved compositions of polymerizable materials for use in micro-fabrication.

SUMMARY OF THE INVENTION

The present invention is directed toward a composition and method of using the same to form a pattern on a substrate using imprint lithography employing dark-field polymerization. To that end, the composition includes a bis vinyl ether component, and an initiator component that produces an acid in response to radiation. The bis vinyl ether component is reactive to the acid and polymerizes in response thereto. The method includes forming a layer of polymerizable material on the substrate, and contacting the layer of polymerizable material with a surface of a mold to conform the layer to the surface. Partial polymerization of the layer is achieved by impinging radiation thereupon and terminating the radiation before polymerization of the polymerizable material is complete. The mold is separated from the layer before complete polymerization of the layer occurs. Complete polymerization of the layer occurs by allowing the acid from the initiator to react with the layer to form a solidified layer of the polymerizable material. These and other embodiments are discussed more fully below.

DETAILED DESCRIPTION OF THE INVENTION

Figure 1:
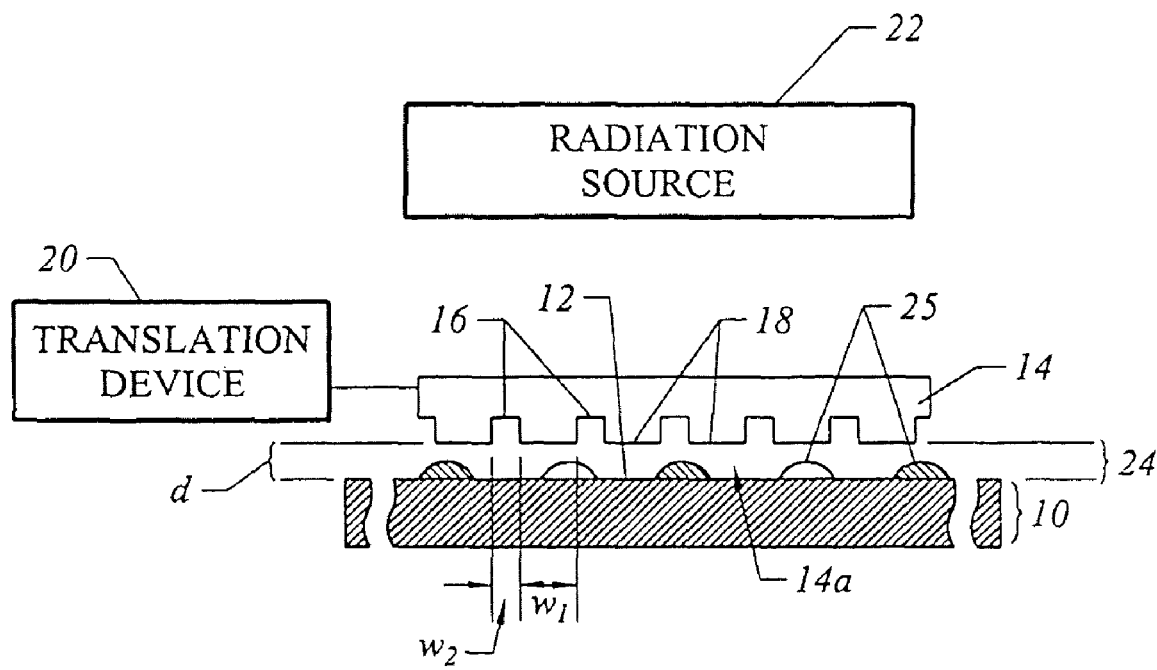
FIG. 1 is a simplified elevation view of a lithographic system in accordance with the present invention.

Referring to FIG. 1, a lithographic system in accordance with an embodiment of the present invention includes a substrate 10, having a substantially planar region shown as surface 12. Disposed opposite substrate 10 is an imprint device 14 having a plurality of features thereon, forming a plurality of spaced-apart recesses 16 and protrusions 18. In the present embodiment, the recesses 16 are a plurality of grooves extending along a direction parallel to protrusions 18 that provide a cross-section of imprint device 14 with a shape of a battlement. However, the recesses 16 may correspond to virtually any feature required to create an integrated circuit. A translation mechanism 20 is connected between imprint device 14 and substrate 10 to vary a distance "d" between imprint device 14 and substrate 10. A radiation source 22 is located so that imprint device 14 is positioned between radiation source 22 and substrate 10. Radiation source 22 is configured to impinge radiation on substrate 10. To realize this, imprint device 14 is fabricated from material that allows it to be substantially transparent to the radiation produced by radiation source 22.

Figure 2:
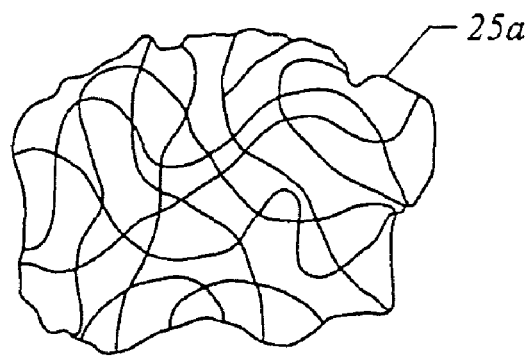
FIG. 2 is a simplified representation of material from which an imprinting layer, shown in FIG. 1, is comprised before being polymerized and cross-linked.

Referring to both FIGS. 1 and 2, an imprinting layer 24 is disposed adjacent to surface 12, between substrate 10 and imprint device 14. Although imprinting layer 24 may be deposited using any known technique, in the present embodiment, imprinting layer 24 is deposited as a plurality of spaced-apart discrete beads 25 of material 25a on substrate 10, discussed more fully below. Imprinting layer 24 is formed from a material 25a that may be selectively polymerized and cross-linked to record a desired pattern. Material 25a is shown in FIG. 3 as being cross-linked at points 25b, forming cross-linked polymer material 25c.

Figure 4:
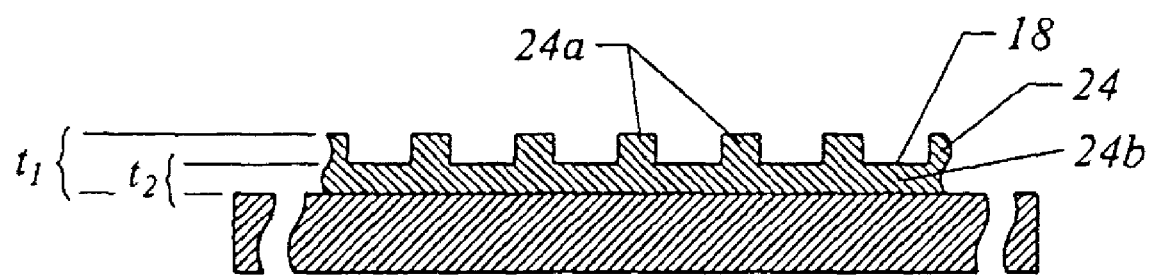
FIG. 4 is a simplified elevation view of an imprint device, shown in FIG. 1, in mechanical contact with an imprint layer disposed on a substrate, in accordance with one embodiment of the present invention.

Referring to both FIGS. 1 and 4, the pattern recorded by imprinting layer 24 is produced, in part, by mechanical contact with imprint device 14. To that end, translation mechanism 20 reduces the distance "d" to allow imprinting layer 24 to come into mechanical contact with imprint device 14, spreading beads 25 so as to form imprinting layer 24 with a contiguous formation of material 25a over surface 12. In one embodiment, distance "d" is reduced to allow sub-portions 24a of imprinting layer 24 to ingress into and fill recesses 16.

Referring to FIGS. 1, 2 and 4, to facilitate filling of recesses 16, material 25a is provided with the requisite viscosity to completely fill recesses 16 in a timely manner, while covering surface 12 with a contiguous formation of material 25a, on the order of a few milliseconds to a few seconds. In the present embodiment, sub-portions 24b of imprinting layer 24 in superimposition with protrusions 18 remain after the desired, usually minimum distance "d" has reached a minimum distance, leaving sub-portions 24a with a thickness $t_1$, and sub-portions 24b with a thickness, $t_2$. Thicknesses "$t_1$" and "$t_2$" may be any thickness desired, dependent upon the application. Further, in another embodiment, sub-portions 24b may be abrogated entirely whereby the only remaining material from imprinting layer 24 are sub-portions 24a, after distance, "d" has reached a minimum value.

Figure 3:
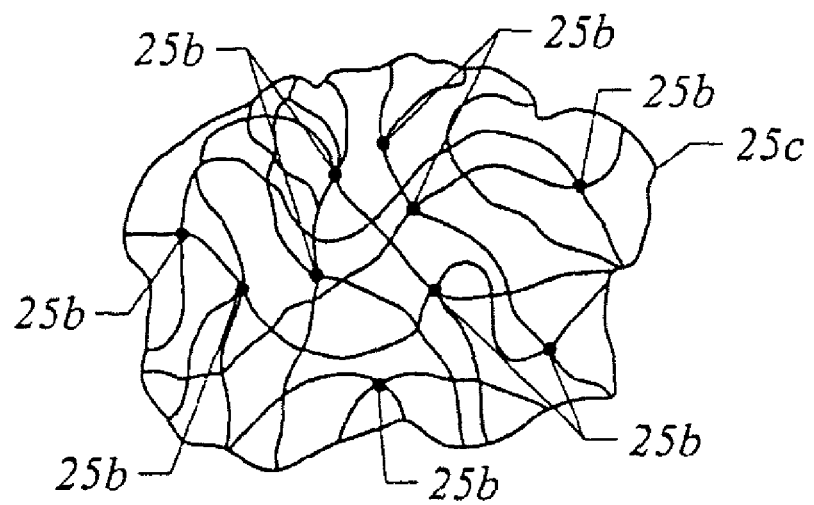
FIG. 3 is a simplified representation of cross-linked polymer material into which the material shown in FIG. 2 is transformed after being subjected to radiation.

Referring to FIGS. 1, 2 and 3, after a desired distance "d" has been reached, radiation source 22 produces actinic radiation that polymerizes and cross-links material 25a, forming cross-linked polymer material 25c. As a result, the composition of imprinting layer 24 transforms from material 25a to material 25c, which is a solid. Specifically, material 25c is solidified to provide surface 24c of imprinting layer 24 with a shape conforming to a shape of a surface 14a of imprint device 14, shown more clearly in FIG. 5.

Referring to FIGS. 1, 2 and 3 an exemplary radiation source 22 may produce ultraviolet radiation. Other radiation sources may be employed, such as thermal, electromagnetic and the like. The selection of radiation employed to initiate the polymerization of the material 25a in imprinting layer 24 is known to one skilled in the art and typically depends on the specific application which is desired. After imprinting layer 24 is transformed to consist of material 25c, translation mechanism 20 increases the distance "d" so that imprint device 14 and imprinting layer 24 are spaced-apart.

Figure 5:
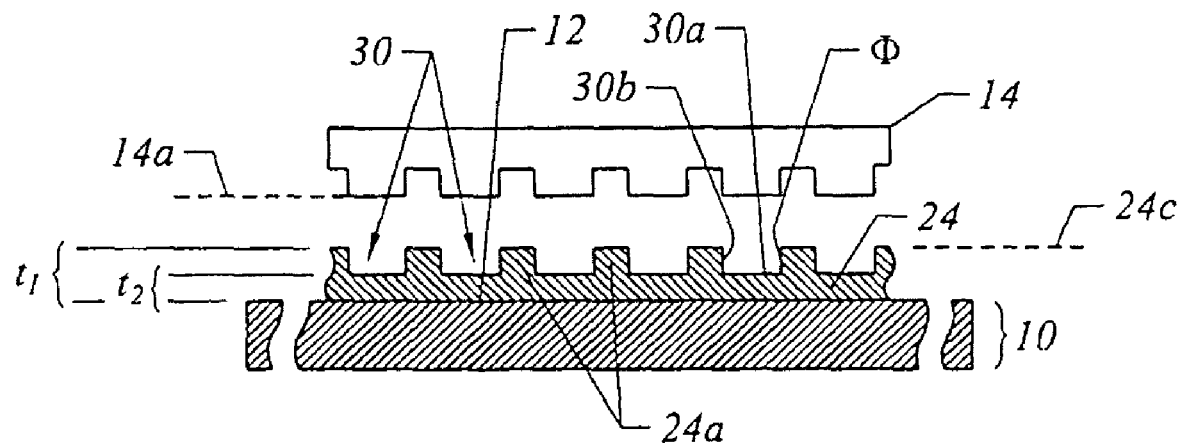
FIG. 5 is a simplified elevation view of the imprint device spaced-apart from the imprint layer, shown in FIG. 4, after patterning of the imprint layer.

Referring to FIG. 5, additional processing may be employed to complete the patterning of substrate 10. For example, substrate 10 and imprinting layer 24 may be selectively etched to increase the aspect ratio of recesses 30 in imprinting layer 24. To facilitate etching, the material from which imprinting layer 24 is formed may be varied to define a relative etch rate with respect to substrate 10, as desired. The relative etch rate of imprinting layer 24 to substrate 10 may be in a range of about 1.5:1 to about 100:1. Alternatively, or in addition to, imprinting layer 24 may be provided with an etch differential with respect to photo-resist material (not shown) selectively disposed on surface 24c. The photo-resist material (not shown) may be provided to further pattern imprinting layer 24, using known techniques. Any etch process may be employed, dependent upon the etch rate desired and the underlying constituents that form substrate 10 and imprinting layer 24. Exemplary etch processes may include plasma etching, reactive ion etching and the like.

Figure 6:
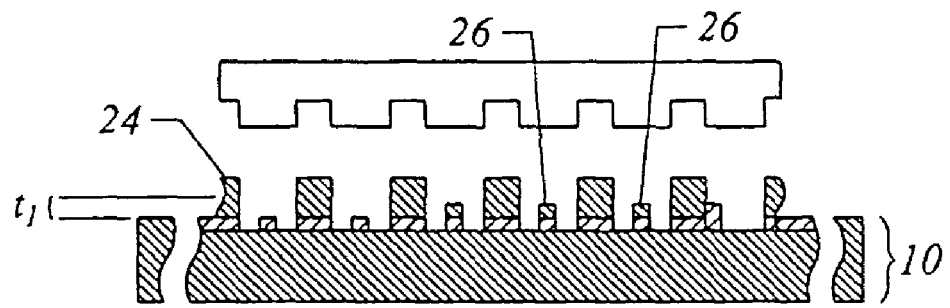
FIG. 6 is a simplified elevation view of the imprint device and imprint layer shown in FIG. 5, with residue remaining in the pattern.

Referring to FIGS. 2, 3 and 6, residual material 26 may be present on imprinting layer 24 after patterning has been completed. Residual material 26 may consist of un-polymerized material 25a, solid polymerized and cross-linked material 25c, substrate 10 or a combination thereof. Further processing may be included to remove residual material 26 using well known techniques, e.g., argon ion milling, a plasma etch, reactive ion etching or a combination thereof. Further, removal of residual material 26 may be accomplished during any stage of the patterning. For example, removal of residual material 26 may be carried out before etching the polymerized and cross-linked imprinting layer 24.

Referring to FIGS. 1 and 5, the aspect ratio of recesses 30 formed from the aforementioned patterning technique may be as great as 30:1. To that end, one embodiment of imprint device 14 has recesses 16 defining an aspect ratio in a range of 1:1 to 10:1. Specifically, protrusions 18 have a width $W_1$ in a range of about 10 nm to about 5000 μm, and recesses 16 have a width $W_2$ in a range of 10 nm to about 5000 μm. As a result, imprint device 14 may be formed from various conventional materials, such as, but not limited to, quartz, silicon, organic polymers, siloxane polymers, borosilicate glass, fluorocarbon polymers, metal, and combinations of the above.

Referring to FIGS. 1 and 2, the characteristics of material 25a are important to efficiently pattern substrate 10 in light of the unique deposition process employed. As mentioned above, material 25a is deposited on substrate 10 as a plurality of discrete and spaced-apart beads 25. The combined volume of beads 25 is such that the material 25a is distributed appropriately over area of surface 12 where imprinting layer 24 is to be formed. As a result, imprinting layer 24 is spread and patterned concurrently, with the pattern being subsequently set by exposure to radiation, such as ultraviolet radiation. As a result of the deposition process it is desired that material 25a have certain characteristics to facilitate rapid and even spreading of material 25a in beads 25 over surface 12 so that the all thicknesses $t_1$ are substantially uniform and all thickness $t_2$ are substantially uniform. The desirable characteristics include having a viscosity approximately that of water, ($H_2O$), 1 to 2 centepoise (csp), or less, as well as the ability to wet surface of substrate 10 to avoid subsequent pit or hole formation after polymerization. To that end, in one example, the wettability of imprinting layer 24, as defined by the contact angle method, should be such that the angle, $\theta_1$, is defined as follows:

$$0 \geq \theta_1 < 75°$$

With these two characteristics being satisfied, imprinting layer 24 may be made sufficiently thin while avoiding formation of pits or holes in the thinner regions, such as sub-portions 24b, shown in FIG. 4.

Referring to FIGS. 2, 3 and 5, another desirable characteristic that it is desired for material 25a to possess is thermal stability such that the variation in an angle Φ, measured between a nadir 30a of a recess 30 and a sidewall 30b thereof, does not vary more than 10% after being heated to 75° C. for thirty (30) minutes. Additionally, material 25a should transform to material 25c, i.e., polymerize and cross-link, when subjected to a pulse of radiation containing less than 5 J cm-2. In the present example, polymerization and cross-linking was determined by analyzing the infrared absorption of the "C=C" bond contained in material 25a. Additionally, it is desired that substrate surface 12 be relatively inert toward material 25a, such that less than 500 nm of surface 12 be dissolved as a result of sixty (60) seconds of contact with material 25a. It is further desired that the wetting of imprint device 14 by imprinting layer 24 be minimized. To that end, the wetting angle, $\theta_2$, should be greater than 75°. Finally, should it be desired to vary an etch rate differential between imprinting layer 24 and substrate 10, an exemplary embodiment of the present invention would demonstrate an etch rate that is 20% less than the etch rate of an optical photo-resist (not shown) exposed to an oxygen plasma.

The constituent components that form material 25*a* to provide the aforementioned characteristics may differ. This results from substrate 10 being formed from a number of different materials. As a result, the chemical composition of surface 12 varies dependent upon the material from which substrate 10 is formed. For example, substrate 10 may be formed from silicon, plastics, gallium arsenide, mercury telluride, and composites thereof. Additionally, substrate 10 may include one or more layers in sub-portion 24*a*, e.g., dielectric layer, metal layers, semiconductor layer and the like.

Referring to FIGS. 2 and 3, in one embodiment of the present invention the constituent components of material 25*a* consist of acrylated monomers or methacrylated monomers that are not silyated, a cross-linking agent, and an initiator. The non-silyated acryl or methacryl monomers are selected to provide material 25*a* with a minimal viscosity, e.g., viscosity approximating the viscosity of water (1-2 cps) or less. The cross-linking agent is included, even though the size of these molecules increases the viscosity of material 25*a*, to cross-link the molecules of the non-silyated monomers, providing material 25*a* with the properties to record a pattern thereon having very small feature sizes, on the order of a few nanometers and to provide the aforementioned thermal stability for further processing. To that end, the initiator is provided to produce a free radical reaction in response to radiation, causing the non-silyated monomers and the cross-linking agent to polymerize and cross-link, forming a cross-linked polymer material 25*c*. In the present example, a photo-initiator responsive to ultraviolet radiation is employed. In addition, if desired, a silyated monomer may also be included in material 25*a* to control the etch rate of the resulting cross-linked polymer material 25*c*, without substantially affecting the viscosity of material 25*a*.

Examples of non-silyated monomers include, but are not limited to, butyl acrylate, methyl acrylate, methyl methacrylate, or mixtures thereof. The non-silyated monomer may make up approximately 25 to 60% by weight of material 25*a*. It is believed that the monomer provides adhesion to an underlying organic transfer layer, discussed more fully below.

The cross-linking agent is a monomer that includes two or more polymerizable groups. In one embodiment, polyfunctional siloxane derivatives may be used as a cross-linking agent. An example of a polyfunctional siloxane derivative is 1,3-bis(3-methacryloxypropyl)-tetramethyl disiloxane. Another suitable cross-linking agent consists of ethylene diol diacrylate. The cross-linking agent may be present in material 25*a* in amounts of up to 20% by weight, but is more typically present in an amount of 5 to 15% by weight.

The initiator may be any component that initiates a free radical reaction in response to radiation, produced by radiation source 22, impinging thereupon and being absorbed thereby. Suitable initiators may include, but are not limited to, photo-initiators such as 1-hydroxycyclohexyl phenyl ketone or phenylbis(2,4,6-trimethyl benzoyl) phosphine oxide. The initiator may be present in material 25*a* in amounts of up to 5% by weight, but is typically present in an amount of 1 to 4% by weight.

Were it desired to include silylated monomers in material 25*a*, suitable silylated monomers may include, but are not limited to, silyl-acryloxy and silyl methacryloxy derivatives. Specific examples are methacryloxypropyl tris(tri-methylsiloxy)silane and (3-acryloxypropyl)tris(tri-methoxysiloxy)-silane. Silylated monomers may be present in material 25*a* in amounts from 25 to 50% by weight. The curable liquid may also include a dimethyl siloxane derivative. Examples of dimethyl siloxane derivatives include, but are not limited to, (acryloxypropyl)methylsiloxane dimethylsiloxane copolymer.

Referring to both FIGS. 1 and 2, exemplary compositions for material 25*a* are as follows:

Composition 1 n-butyl acrylate+(3-acryloxypropyltristrimethyl-siloxy)silane+1,3-bis(3-methacryloxypropyl)tetramethyldisiloxane Composition 2 t-n-butyl acrylate+(3-acryloxypropyltristrimethyl-siloxy)silane+Ethylene diol diacrylate Compositions 3 t-butyl acrylate+methacryloxypropylpentamethyldisiloxane+1,3-bis(3-methacryloxypropyl)tetramethyldisiloxane The above-identified compositions also include stabilizers that are well known in the chemical art to increase the operational life, as well as initiators.

Figure 7:
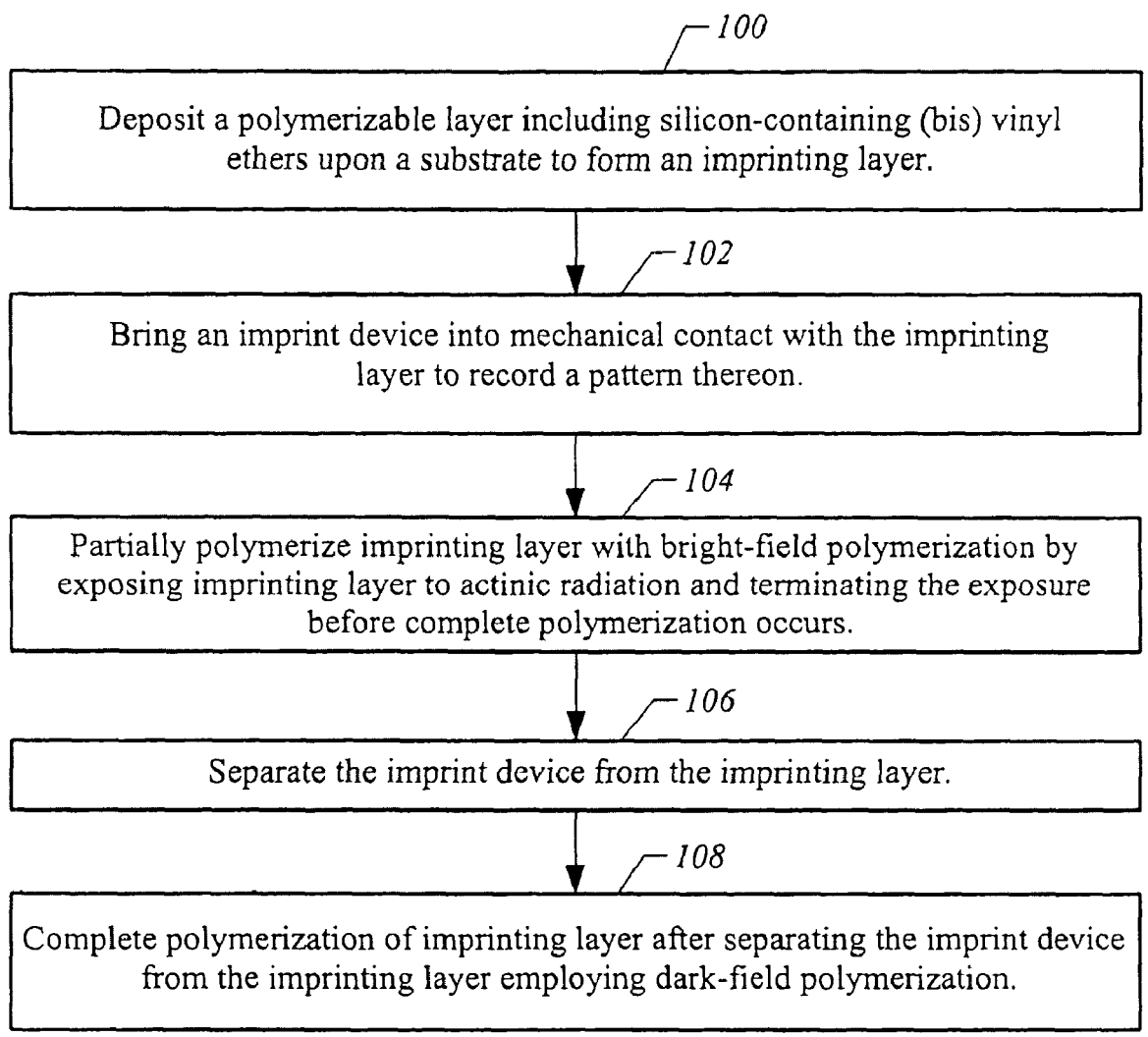
FIG. 7 is a flow diagram showing polymerization employing dark field polymerization in accordance with one embodiment of the present invention.

Referring to both FIGS. 1 and 7, another class of compositions that have shown promise for use as imprinting layer 24 is silicon containing (bis)vinyl ethers. Silicon-containing (bis)vinyl ethers have demonstrated the suitable properties of viscosity and wetting, discussed above. Other advantages, however, are provided by silicon-containing (bis)vinyl ethers. By including a suitable initiator, silicon-containing (bis)vinyl ethers may polymerize under dark conditions, i.e., in the absence of actinic radiation, such as UV light. For example, a mixture of (bis)vinyl ethers and acid facilitates polymerization in the presence of air. Specifically, exposing the mixture of (bis)vinyl ethers and a material capable of releasing acid when exposed to actinic, such as UV light, facilitates polymerization of the (bis)vinyl ether. Examples of such acid-producing materials include, but are not limited to triphenylsulphonium salts and diphenyliodonium salts with the following counter-ions: antimony hexafluoride; phosphorus hexafluoride; boron tetrafluoride; tris(trifluoromethylsulphonyl)methide. In an example of such a composition, the exposure of the mixture of (bis) vinyl ethers and diphenyl-iodonium tris(trifluoromethylsulphonyl)methide (referred hereafter as diaryl-iodonium methide) need only be for a short amount of time to initiate polymerization. Complete polymerization of (bis)vinyl ethers may occur in the presence of air. Specifically, once exposure to the UV light has terminated, acid production by diaryl-iodonium methide continues to facilitate complete polymerization of the (bis)vinyl ether in the absence of UV light. As a result, the time required to polymerize the same by exposure to actinic radiation, such as UV light, may be substantially reduced. This greatly increases through-put. Exemplary silicon-containing (bis)vinyl ethers that may be employed to form imprinting layer 24 include bis(vinyloxymethyl)dimethysilane and bis(divinyloxymethyl)tetramethyldisiloxane. An exemplary mixture of (bis)vinyl ethers may include 25 diaryl-iodonium methide initiator with the remaining portion being either bis(vinyloxymethyl)dimethysilane or bis(divinyloxymethyl)tetramethyldisiloxane, and a few parts per million of a base. The base reduces the probability of unwanted acid production by the diaryl-iodonium methide initiator. It is also possible, to create other mixtures to obtain a desired viscosity. For example, bis(vinyloxymethyl)dimethysilane or bis(divinyloxymethyl)tetramethyldisiloxane may be mixed with a monomer, such as ethylene glycol divinyl ether, as well as the diaryl iodonium methide and base. This also forms a suitable material for use in forming imprinting layer 24.

Taking advantage of properties of the silicon-containing (bis)vinyl ethers, a method of imprinting includes depositing a polymerizable layer including silicon-containing (bis)vinyl ethers upon substrate 10 to form imprinting layer 24, at step 100. Imprint device 14 is brought into mechanical contact with imprinting layer 24 to record the pattern thereon, at step 102. After imprint device 14 is brought into contact with imprinting layer 24, bright-field polymerization occurs by exposing imprinting layer 24 to actinic radiation, at step 104. To increase the throughput of the process the bright-field polymerization achieves only partial polymerization. As a result bright-field polymerization occurs for the minimum time required to ensure that the pattern recorded in imprint layer 24 is sufficient to maintain a stable pattern when imprinting device 14 is separated from imprinting layer 24, at step 106. The time during which bright-field polymerization takes place is dependent upon, inter alia, the feature size in the pattern, the thickness of imprinting layer 24, radiation intensity, as well as environmental conditions. Polymerization is then completed employing dark-field polymerization, at step 108. Thereafter, subsequent processing steps may take place, as discussed above.

Figure 8:
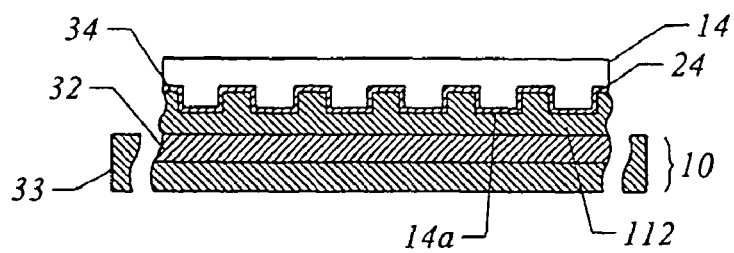
FIG. 8 is a simplified elevation view of material in an imprint device and substrate employed with the present invention in accordance with an alternate embodiment.

Referring to FIGS. 2 and 8, employing the compositions described above in material 25a to facilitate imprint lithography was achieved by defining a surface 112 of substrate 110 with a planarization layer 32 disposed adjacent to a wafer 33. The primary function of planarization layer 32 is to ensure surface 112 is planar. To that end, planarization layer 32 may be formed from a number of differing materials, such as, for example, thermoset polymers, thermoplastic polymers, polyepoxies, polyamides, polyurethanes, polycarbonates, polyesters, and combinations thereof. It is desired that planarization layer 32 be formed from material that polymerizes, or cures, in response to the actinic radiation employed to cure imprint layer 24 and adheres well thereto and other adjacent layers and experiences less than 15% shrinkage during curing. Planarization layer 32 should not substantially penetrate imprinting layer 24. Specifically, it is desired that planarization layer 32 not swell to the extent where there is more than 5% of planarization layer 32 penetrating imprinting layer 24. Additionally, it is desired that the material have a viscosity of less than 5 cps and more particularly less than 2 cps at 20° C. A class of material that demonstrates these characteristics is non-silicon-containing acrylates. An exemplary material is ethylene glycol diacrylate combined with an initiator and stabilizers for long shelf life. The initiator, may be any of those discussed above and is responsive to actinic radiation, such as UV light and causes a free radical which facilitates polymerization and cross-linking of the ethylene glycol acrylate. Typically, the initiator does not constitute more than 5% of the mixture.

Employing ethylene glycol diacrylate, planarization layer 32 is fabricated in a manner similar to imprinting layer 24 using a featureless mold having a planar surface. In this manner, planarization layer 32 is fabricated to possess a continuous, smooth, relatively defect-free surface that may exhibit excellent adhesion to the imprinting layer 24.

Additionally, to ensure that imprinting layer 24 does not adhere to imprint device 14, surface 14a may be treated with a modifying agent. One such modifying agent is a release layer 34 formed from a fluorocarbon silylating agent. Release layer 34 and other surface modifying agents, may be applied using any known process. For example, processing techniques that may include chemical vapor deposition method, physical vapor deposition, atomic layer deposition or various other techniques, brazing and the like. In this configuration, imprinting layer 24 is located between planarization layer 32 and release layer 34, during imprint lithography processes.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. An imprint lithography method of forming a layer of polymerized material on a substrate, the method comprising:
    depositing a polymerizable material on the substrate;
    wherein the polymerizable material comprises: a silicon-containing (bis)vinyl ether component; and an initiator component capable of forming an acid in response to actinic radiation;
    contacting the polymerizable material with a surface of an imprint lithography mold, such that the polymerizable material substantially conforms to the surface of the imprint lithography mold and forms a layer of polymerizable material between the substrate and the surface of the imprint lithography mold;
    applying actinic radiation to the polymerizable material to initiate polymerization of the polymerizable material;
    separating the imprint lithography mold from the polymerizable material before polymerization of the polymerizable material is complete, wherein separating the imprint lithography mold from the incompletely polymerized material comprises exposing a surface of the incompletely polymerized material to air; and
    then, with the surface of the incompletely polymerized material exposed to air, further polymerizing the incompletely polymerized material to form a solidified layer of completely polymerized material on the substrate.

2. The method of claim 1 wherein depositing the polymerizable material comprises forming a plurality of spaced-apart, discrete beads of the polymcrizable material on the substrate.

3. The method of claim 1 wherein the actinic radiation comprises ultraviolet radiation.

4. The method of claim 1 wherein the surface of the mold comprises a pattern, the pattern comprising protrusions and recesses, and wherein a minimum width of the protrusions and/or recesses is about 10 nm.

5. The method of claim 4, wherein contacting the polymerizable material with the surface of the mold comprises forming the pattern in the polymerizable material.

6. The method of claim 5, wherein the pattern is substantially stable when the polymerization is terminated.

7. The method of claim 1 further comprising terminating application of the actinic radiation before separating the mold from the incompletely polymerized material.

8. The method of claim 1 wherein the further polymerization comprises dark-field radiation.

9. The method of claim 1 wherein the polymerizable material comprises an initiator that forms an acid in the presence of the actinic radiation, and wherein the acid facilitates complete polymerization of the partially polymerized material in the absence of the actinic radiation.

10. The method of claim 1 further comprising forming a planarization layer on the substrate before the polymerizable material is deposited on the substrate.

11. The method of claim 1 further comprising treating the surface of the mold with a modifying agent.

12. The method of claim 1 further comprising etching the completely polymerized material.

13. The method of claim 12, wherein the etching comprises plasma etching or reactive ion etching.

14. The method of claim 1 further comprising removing residual material from the incompletely or completely polymerized material, wherein residual material comprises unpolymerized material, solid polymerized and cross-linked material, substrate, or a combination thereof.

15. The method of claim 14, wherein the residual material is removed by a process comprising argon ion milling, plasma etching, reactive ion etching, or a combination thereof.

16. An imprint lithography method of forming a layer of polymerized material on a substrate, the method comprising:
depositing a polymerizable material on the substrate;
wherein the polymerizable material comprises: a silicon-containing (bis)vinyl ether component; and an initiator component capable of forming an acid in response to actinic radiation;
contacting the polymerizable material with a surface of an imprint lithography mold, such that the polymerizable material substantially conforms to a space between the substrate and the surface of the imprint lithography mold and forms a layer of polymerizable material between the substrate and the surface of the imprint lithography mold;
applying actinic radiation to the polymerizable material to initiate polymerization of the polymerizable material;
separating the imprint lithography mold from the polymerizable material before polymerization of the polymerizable material is complete thus leaving the molded, incompletely polymerized material on the substrate, wherein separating the imprint lithography mold from the incompletely polymerized material comprises exposing a surface of the incompletely polymerized material to air; and
then, with the surface of the incompletely polymerized material exposed to air, further polymerizing the incompletely polymerized material to form a solidified layer of completely polymerized material on the substrate.

17. The method of claim 16 wherein depositing the polymerizable material comprises forming a plurality of spaced-apart, discrete beads of the polymerizable material on the substrate.

18. The method of claim 16 wherein the actinic radiation comprises ultraviolet radiation.

19. The method of claim 16 wherein the surface of the imprint lithography mold comprises a pattern, the pattern comprising protrusions and recesses, and wherein a minimum width of the protrusions and/or recesses is about 10 nm.

20. The method of claim 16 wherein the further polymerization comprises dark-field radiation.

21. The method of claim 16 wherein the polymerizable material comprises an initiator that forms an acid in the presence of the actinic radiation, and wherein the acid facilitates complete polymerization of the partially polymerized material in the absence of the actinic radiation.

22. An imprint lithography method of forming a layer of polymerized material on a substrate, the method comprising:
depositing a polymerizable material on the substrate, wherein the polymerizable material comprises:
a silicon-containing (bis)vinyl ether component; and
an initiator component capable of forming an acid in response to actinic radiation;
contacting the material with a surface of an imprint lithography mold, such that the material substantially conforms to the surface of the imprint lithography mold and forms a layer of polymerizable material between the substrate and the surface of the imprint lithography mold;
applying actinic radiation to the material to initiate polymerization of the material;
separating the imprint lithography mold from the polymerizable material before polymerization of the polymerizable material is complete; and
then further polymerizing the incompletely polymerized material to form a solidified layer of completely polymerized material on the substrate.

* * * * *